United States Patent [19]
Liang et al.

[11] Patent Number: 6,083,795
[45] Date of Patent: Jul. 4, 2000

[54] LARGE ANGLE CHANNEL THRESHOLD IMPLANT FOR IMPROVING REVERSE NARROW WIDTH EFFECT

[75] Inventors: Mong-Song Liang; Ching-Hsiang Hsu, both of Hsin-Chu, Taiwan

[73] Assignee: Taiwan Semiconductor Manufacturing Company, Hsin-Chu, Taiwan

[21] Appl. No.: 09/020,497

[22] Filed: Feb. 9, 1998

[51] Int. Cl.[7] .................... H01L 21/336; H01L 21/425
[52] U.S. Cl. .................... 438/289; 438/294; 438/525; 257/376
[58] Field of Search .................... 257/305, 336, 257/392; 438/302, 305, 290, 300, 289, 294, 525

[56] References Cited

U.S. PATENT DOCUMENTS

| | | | |
|---|---|---|---|
| 4,033,026 | 7/1977 | Pashley | 438/217 |
| 4,435,896 | 3/1984 | Parrillo et al. | 438/276 |
| 4,889,825 | 12/1989 | Parillo | 438/443 |
| 5,045,898 | 9/1991 | Chen et al. | 257/305 |
| 5,344,787 | 9/1994 | Nagalingam et al. | 438/298 |
| 5,396,096 | 3/1995 | Akamatsu et al. | 257/336 |
| 5,409,848 | 4/1995 | Han et al. | 438/302 |
| 5,518,941 | 5/1996 | Lin et al. | 438/291 |
| 5,688,701 | 11/1997 | Kobayashi et al. | 438/289 |
| 5,719,081 | 2/1998 | Racanelli et al. | 438/290 |
| 5,736,416 | 4/1998 | Johansson | 438/302 |
| 5,811,334 | 9/1998 | Buller et al. | 438/264 |
| 5,926,712 | 7/1999 | Chen et al. | 438/291 |

OTHER PUBLICATIONS

"Silicon Processing For The VLSI Era–vol. 3" Lattice Press, Sunset Beach, CA, 1995, p. 409–413.

*Primary Examiner*—Olik Chaudhuri
*Assistant Examiner*—William David Coleman
*Attorney, Agent, or Firm*—George O. Saile; Stephen B. Ackerman; William J. Stoffel

[57] ABSTRACT

The present invention provides a method of manufacturing MOS device having threshold voltage adjustment region 28 ormed using a large angled implant. The invention's angled implant serves as both (a) a Vt adjustment I/I and (b) a Channel stop I/I by (1) increasing the threshold voltage (Vt) and (2) reducing the leakage current. The method comprises forming spaced field oxide regions having bird's beaks on a semiconductor substrate. A field implant is performed using the spaced field oxide regions as an implant mask formed a deep channel stop region 24. Next, a sacrificial oxide layer 20 is formed over the resultant surface. In a critical step, a threshold voltage adjustment region 28 is formed by performing a large angled implant of a p-type ions. The p-type ions into are implanted into the channel region 19 and under the bird's beak 18 such that the threshold voltage is higher under the bird's beak than in the channel region 19. A MOS transistor is then formed over the channel region. The large angled threshold voltage implant of the present invention eliminates the reverse narrow width effect (e.g., reduced threshold voltage (Vt) and increased leakage currents).

17 Claims, 7 Drawing Sheets

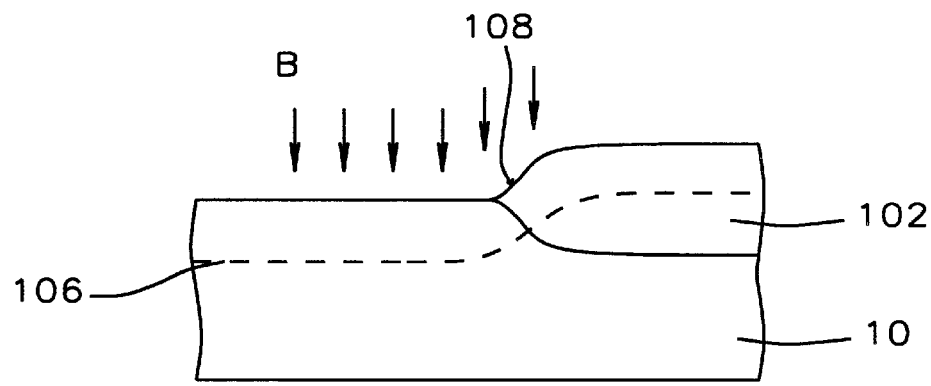
FIG. 1 - Prior Art
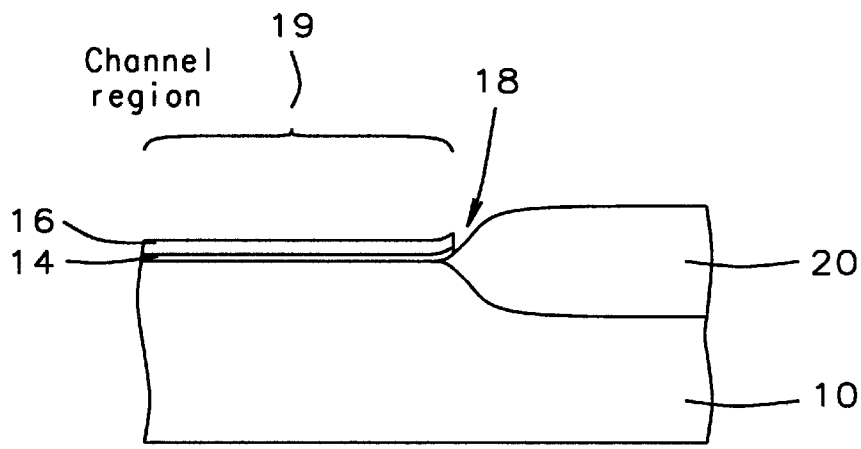
FIG. 2
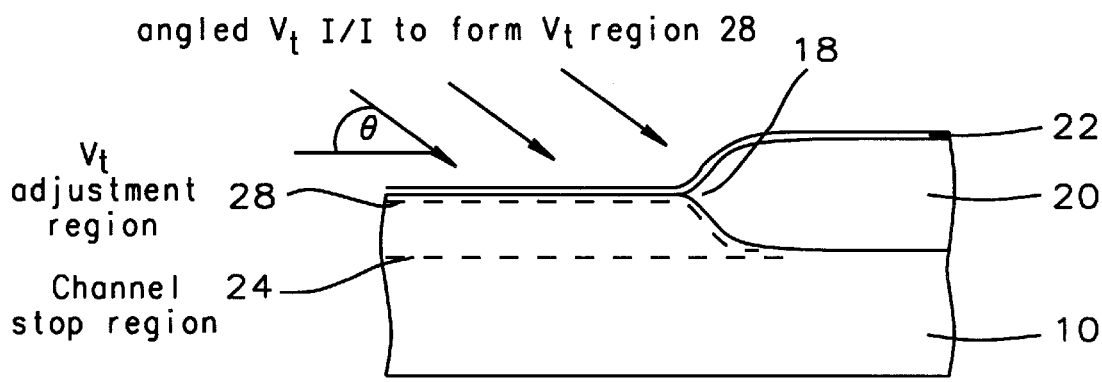
FIG. 3

LARGE ANGLE CHANNEL THRESHOLD IMPLANT FOR IMPROVING REVERSE NARROW WIDTH EFFECT

BACKGROUND OF INVENTION

1) Field of the Invention

This invention relates generally to fabrication of a threshold voltage adjustment layer for a semiconductor device and more particularly to an oblique implant process to form an improved threshold voltage adjustment layer to improve the reverse narrow width effect for the fabrication of a CMOS semiconductor device.

2) Description of the Prior Art

In the forming of large scale integrated circuits using field effect transistors, reducing the leakage current and increasing the threshold voltages near the bird's beak in field oxide regions is of critical importance.

In a conventional process, as shown in FIG. 1, a field oxide region 102 is formed on a substrate. A vertical boron implant (B or $BF_2$) is performed to form a channel stop layer and also a punchthru stop 106. We have noted that a problem with this structure is the peak concentration of the ptype implant is far from the interface of the field oxide and the silicon near the bird's beak area 108. This structure suffers from a "reverse narrow width effect" where the threshold voltage is reduced and the leakage current is increased as the width of the device is scaled.

Furthermore, as devices are shrunk further and various LOCOS and non-LOCOS isolation techniques are implemented, the sharp transition between the field oxide and the gate oxide at the edges of the device causes a penetration of the electric field from the active channel to field regions. This increases the threshold voltage of the device. However, when the channel stop implant/punchthru stop implant is performed after field oxidation, the depletion of surface concentration results in a lower threshold voltage as the width of channel decreases. This is called reverse narrow width effect.

Therefore, an improved method should be developed to reduce this reverse narrow width problem. Workers in the field have attempted to solve other semiconductor isolation problems. U.S. Pat. No. 5,518,941 (Lin et al.) shows a method of forming field implant channel stop regions and a device using a field implant channel stop region to improve isolation between devices in integrated circuits using field effect transistors. The field implant channel stop region is formed by a large angle titled implant beam or a higher energy normally directed implant.

U.S. Pat. No. 5,344,787 (Nagalingam et al.) shows a method of forming P-channel connected to $N^+$ S/D regions formed using an angled implant. U.S. Pat. No. 5,396,096 (Akamatsu et al.) shows a method of forming a channel stop region under the isolation.

SUMMARY OF THE INVENTION

It is an object of the present invention to provide a method for fabricating a threshold voltage adjustment layer that reduces the reverse narrow-width effect.

It is an object of the present invention to provide a method for fabricating a threshold voltage adjustment layer that reduces the leakage current and increases the threshold voltage near the bird's beak in a MOS transistor.

It is an object of the present invention to provide a method for fabricating a threshold voltage adjustment layer under the bird's beak of a field oxide region by using a large angle ion implant.

To accomplish the above objectives, the present invention provides a method of manufacturing MOS device which is characteriz ed by first forming spaced field oxide regions on a semiconductor substrate. The field oxide regions have bird's beaks and the spaced field oxide regions define channel regions 19. A field implant is performed using the spaced field oxide regions as an implant mask forming a deep channel stop region 24. Next, a sacrificial oxide layer 20 is formed over the resulted surface.

In an important step, a threshold voltage adjustment region 28 is formed by performing an angled implant of a p-type ions. The field oxide region 20 is used as an implant mask. Ions are implanted into the channel region 19 and under the bird's beak 18 such that the threshold voltage is higher under the bird's beak 18 than in the channel region 19. The angled implant comprises striking a tilted substrate with an ion beam where the substrate 10 is tilted at an angle between 15 and 45 degrees relative to the ion beam. The sacrificial oxide layer 22 is then removed. A gate oxide layer 40 is then formed over the channel region 19. A gate electrode, source/drain regions other elements are then formed over the channel region 19 to complete the MOS device.

The large angled threshold voltage implant of the present invention eliminates the reverse narrow width effect. The large angled threshold voltage implant positions impurity ion under field oxide region near the birds beak 18 forms a threshold voltage adjustment region. This threshold voltage adjustment region increases the threshold voltage under the bird's beak so that it is higher than the threshold voltage in the channel region. The invention's angled implant serves as both (a) a Vt adjustment I/I and (b) a Channel stop I/I by both: (1) increasing the threshold voltage (Vt) and (2) reducing the leakage current.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIGS. 1 through 4 are cross sectional views for illustrating a method for performing the large angled threshold voltage implant according to the present invention.

DETAILED DESCRIPTION OF THE PREFERRED EMBODIMENTS

Figure 4:
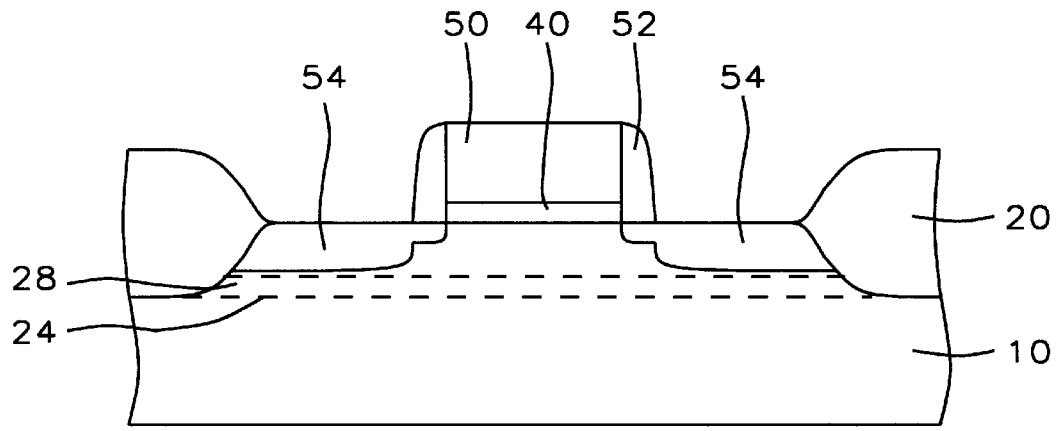

The present invention will be described in detail with reference to the accompanying drawings. The invention is a method of fabricating channel threshold implant regions to increase the dopant concentration under a bird's beak in a field oxide region. The channel threshold implant increases the threshold Voltage (Vt) and reduces leakage.

As shown in FIG. 2, spaced field oxide regions 20 are formed on a semiconductor substrate. The substrate can be a silicon substrate having a p-type background impurity concentration preferably in a range of between about 1E15 and 1E16 atoms/cm$^3$. Also the substrate can contain at least a p-well and the field oxide regions and the channel region can be formed over the p-well.

The field oxide regions 20 have bird's beaks and he spaced field oxide regions defining a channel region 19. The paced field oxide regions can be formed as follows. A pad oxide 14 and a silicon nitride layer 16 are formed sequentially over the substrate 10. The pad oxide 14 can be formed using a thermal oxidation process and preferably has a thickness in a range of between about 3000 and 5000 Å.

As shown in FIG. 2, the pad oxide 14 and the silicon nitride layer 16 are patterned forming spaced field oxide region openings which expose the substrate 10. The exposed substrate 10 is oxidized forming spaced field oxide regions 20 in the field oxide region openings. The spaced field oxide regions 20 have bird's beaks 18. The spaced field oxide regions 20 defined a channel region 19 for a subsequently formed transistor. The spaced field oxide regions 20 preferably have a depth from the substrate surface in a range of between about 3000 and 5000 Å.

Another method of forming these field oxide regions is describe by E. Kooi in U.S. Pat. No. 3,970,486, wherein selected surface portions of a silicon substrate are masked against oxidation and the unmasked surface is oxidized to grow a thermal oxide which in effect sinks into the silicon surface at the unmasked areas. The mask is removed and semiconductor devices can be formed in the openings between the isolation regions. The field oxide regions can be formed by any variation on the LOCOS process.

As shown in FIG. 3, a field implant is performed to form a deep channel stop region 24 (e.g., P-channel stop region). The deep channel stop regions 24 preferably have a concentration in a range of between about 1E17 and 5E15 atoms/cc and a depth from the substrate surface in a range of between about 0.1 $\mu$m and 0.25 $\mu$m.

The field implant is preferably performed by implanted B ions at an energy in a range of between about 50 KeV and 130 KeV, a dose in a range of between about 5E12 and 5E13 atoms/cm$^2$.

Next, a sacrificial oxide layer 22 is formed over the resultant surface. The sacrificial oxide layer 22 preferably has a thickness in a range of between about 100 and 150 Å.

Still referring to FIG. 3, in a critical step, a threshold adjustment region 28 is formed by performing an angled implant of a p-type ions. The angled implant uses the field oxide region 20 as an implant mask and the p-type ions are implanted into the channel region 19 and under the bird's beak such that the threshold voltage is higher under the bird's beak than in the channel region 19.

The angled implant comprises striking a tilted substrate with an ion beam where the substrate 10 is tilted at an angle between 15 and 45 degrees relative to the ion beam. By use of the term "angled implant" it is understood to that the dopant is ion implanted at an angle other than perpendicular or parallel to the substrate material, ie., between 0° and 90° form the line perpendicular to the surface of the substrate, as indicated by the angle Θ in FIG. 3. The angled implant implants B ions at an energy in a range of between about 150 KeV and 200 KeV, a dose in a range of between about 5E12 and 5E13 atoms/cc.

The threshold voltage adjustment regions 28 preferably have a concentration in a range of between about 1E17 atoms/cc and 5E17 atoms/cc and a depth from the substrate surface in a range of between about 500 and 1500 Å.

The sacrificial oxide layer 22 is then removed.

A gate electrode, source/drain regions other elements are then formed over the channel region 19 to complete the MOS device. As shown in FIG. 4, a gate oxide layer 40 is then formed over the channel region 19. The gate oxide preferably has a thickness in a range of between about 60 and 100 Å. A conductive layer is formed over the gate oxide.

The conductive layer is patterned to form a gate electrode 50 over the channel region 19. Spacers 52 are formed on the gates. Source and drain regions 54 are formed adjacent to the gate electrode and adjacent to the field oxide regions 20 to complete a transistor.

Figure 5:
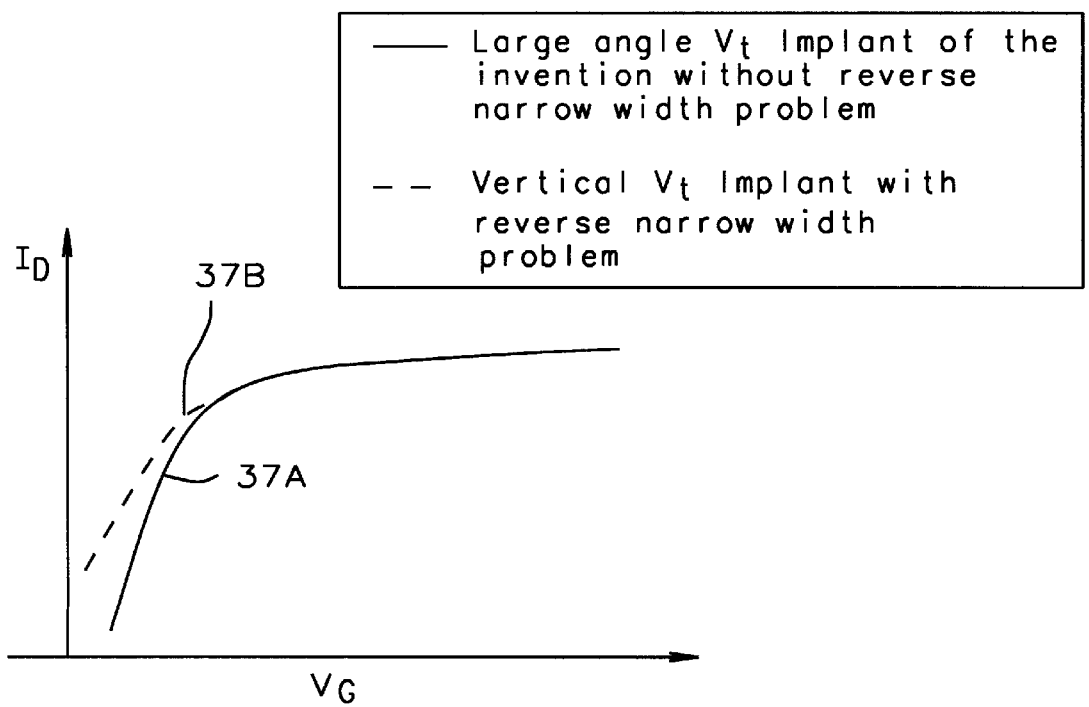
FIG. 5 is a graph showing drain current (Id) vs Gate Voltage (Vg) comparing the large angled threshold voltage implant with a vertical Vt implant.

FIG. 5 is a graph showing drain current (Id) vs Gate Voltage (Vg) comparing the large angled threshold voltage implant 37A with a vertical Vt implant 37B. As the figure shows, the invention angled threshold voltage implant improves the curve by reducing the VT and the reverse width effect (leakages) compared the conventional vertical implant 37B.

Figure 6:
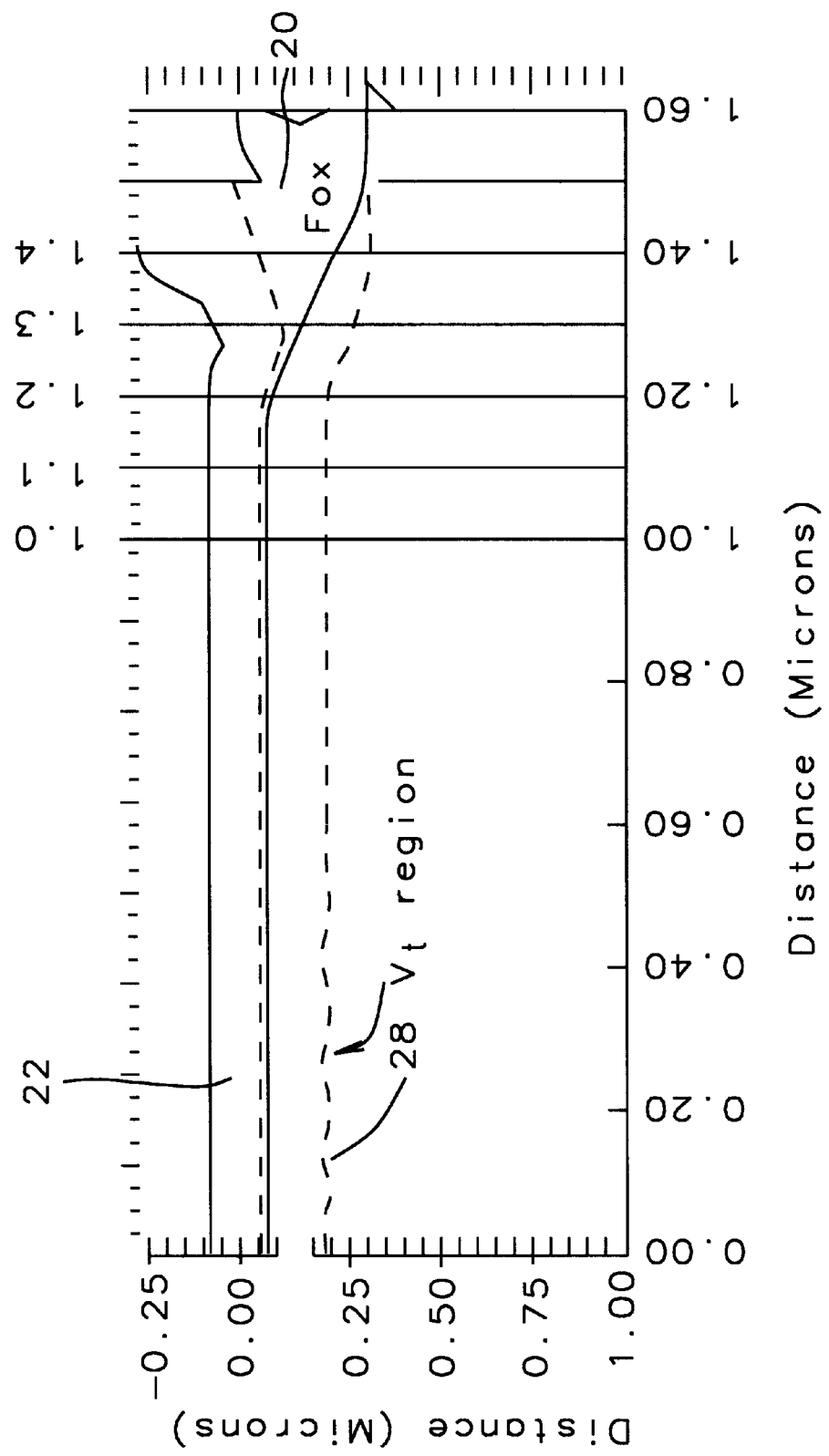
FIG. 6 is a cross sectional view of a substrate having a Vt adjustment layer and a field oxide which shows locations (1.0, 1.2, etc.) where profiles are shown in FIGS. 7 and 8.
Figure 7:
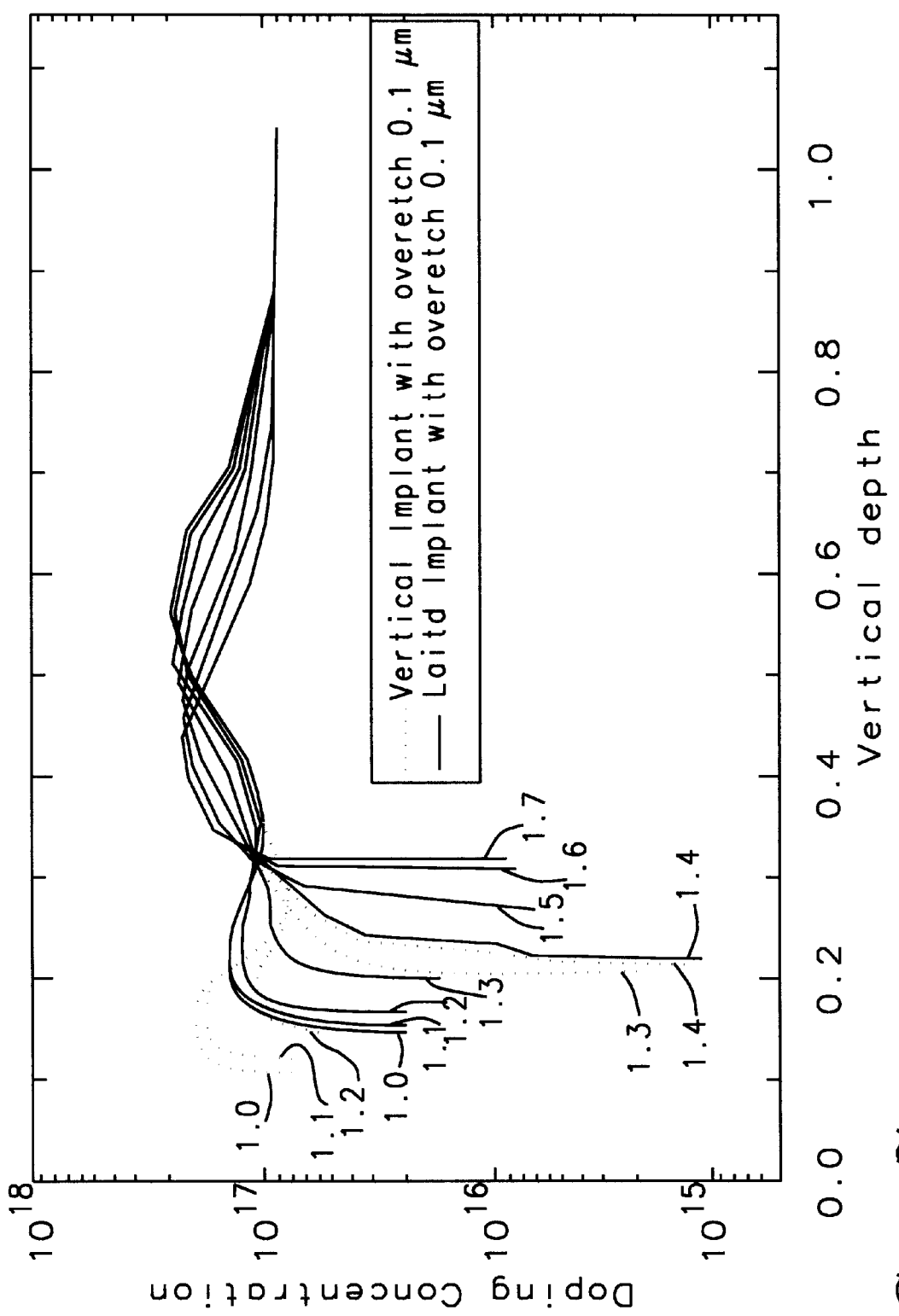
FIG. 7 shows a graph of doping concentration as a function of depth and location along the channel and field oxide region for the large angled threshold voltage implant (LAITD) of the invention compared to a vertical implant.

FIG. 6 shows a cross sectional view of a substrate having a field oxide layer 20 and a threshold voltage adjustment region 28. Vertical lines (e.g., 1.0, 1.1, 1.2) are the locations (positions) concentration reading are taken in FIG. 7. FIG. 7 shows the doping concentration as a function of depth and location along the channel and field oxide region.

FIG. 7 shows that the large angled threshold voltage implant (LAITD) of the invention increases the Boron concentration under the birds beak compared to a vertical threshold voltage adjustment region. The Angled implant was performed with BF$_2$, at a dose of 9E12 atom/cc, a energy of 170 KeV and at an angle of 45 degrees. The doping profile is from locations 1.0 to 1.7 $\mu$m. The solid lines are for the LAITD implant with a overetch of 0.1 $\mu$m. the dashed lines show the profile for the vertical implant with a overetch of 0.1 $\mu$m.

Figure 8:
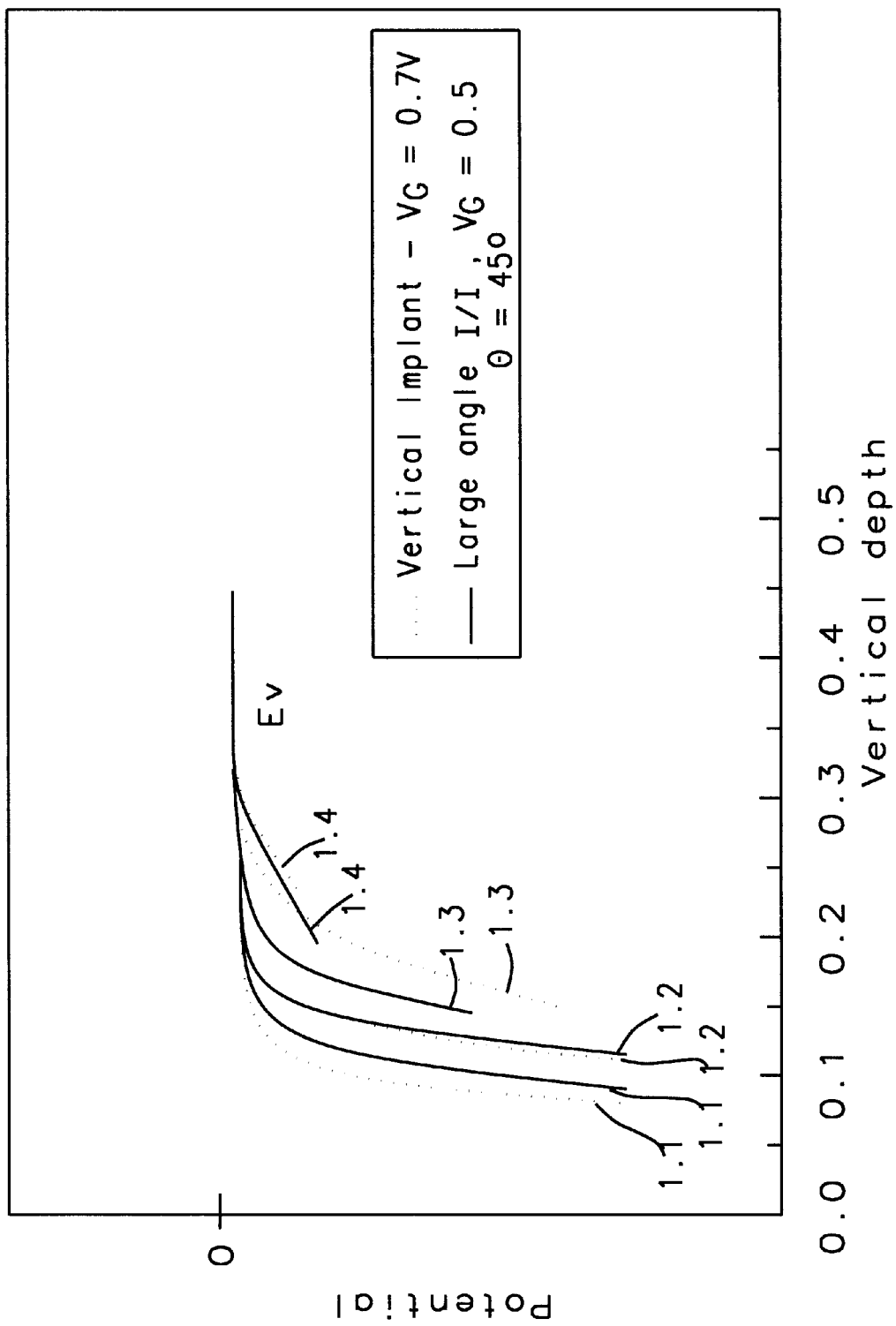
FIG. 8 shows a band diagram of potential Valence band energy (Ev) vs vertical depth for the large angled threshold voltage implant (LAITD) of the invention compared to a vertical implant.

FIG. 8 is a band diagram with over etching 0.1 $\mu$m showing Potential Ev (valence band edge) as a function of vertical depth from the substrate surface. FIG. 8 shows that the large angled threshold voltage implant of the current invention has a higher Vt than a vertical threshold implant, especially at locations 1.3 and 1.4 (e.g., under the bird's beak) where the "reverse narrow width effect" is eliminated.

The large angled threshold voltage implant of the invention can be used on PMOS devices, N-well and twin CMOS devices. The N-type angled implant comprises striking a tilted substrate with an ion beam where the substrate 10 is tilted at an angle between 15 and 45 degrees relative to the ion beam. The angled implant implants Phosphorus ions at an energy in a range of between about 40 KeV and 70 KeV, a dose in a range of between about 5E12 and 5E13 atoms/cm$^3$. The n-type threshold voltage adjustment regions preferably have a concentration in a range of between about 1E17 and 5E17 atoms/cm$^3$ and a depth from the substrate surface in a range of between about 500 and 1500 Å.

Figure 9A:
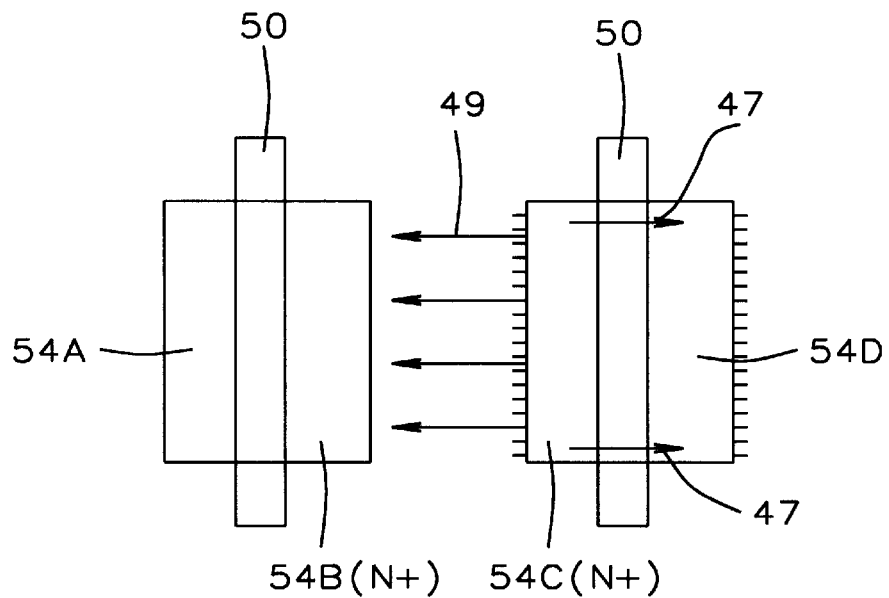
FIG. 9A shows a top down view of two adjacent polysilicon gates showing the locations of the improved (Vt) threshold voltages improvements of the present invention.
Figure 9B:
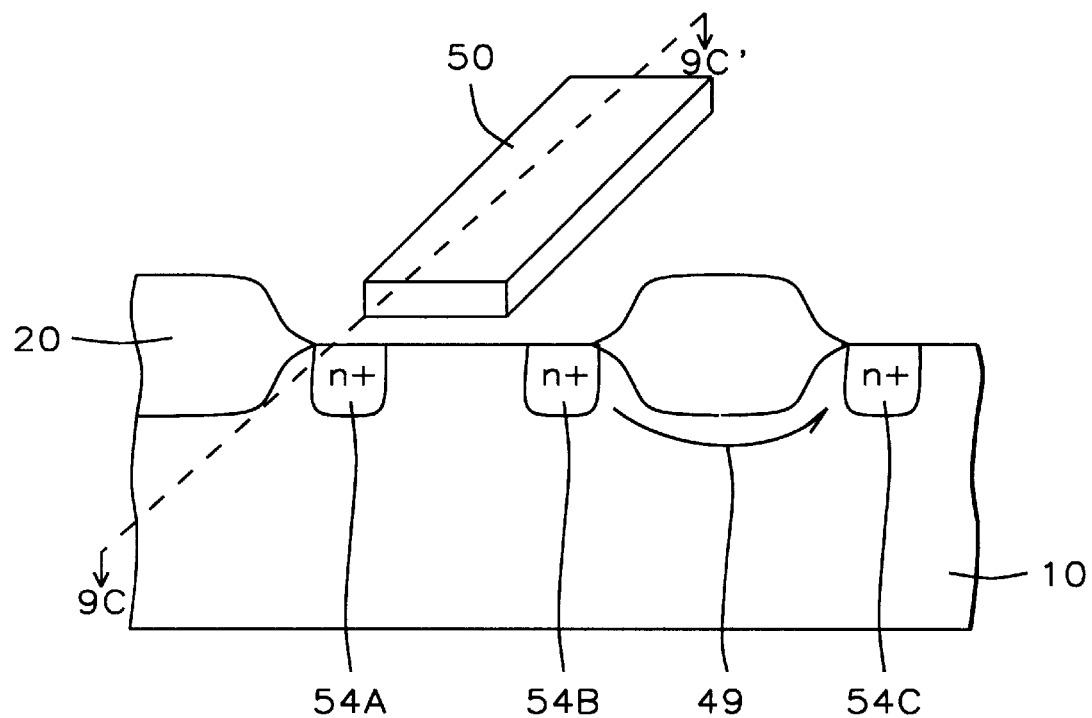
FIG. 9B shows a cross sectional three dimensional representation of a poly gate 50 with source/drain regions 54A, 54B, 54C and field oxide regions 20.
Figure 9C:
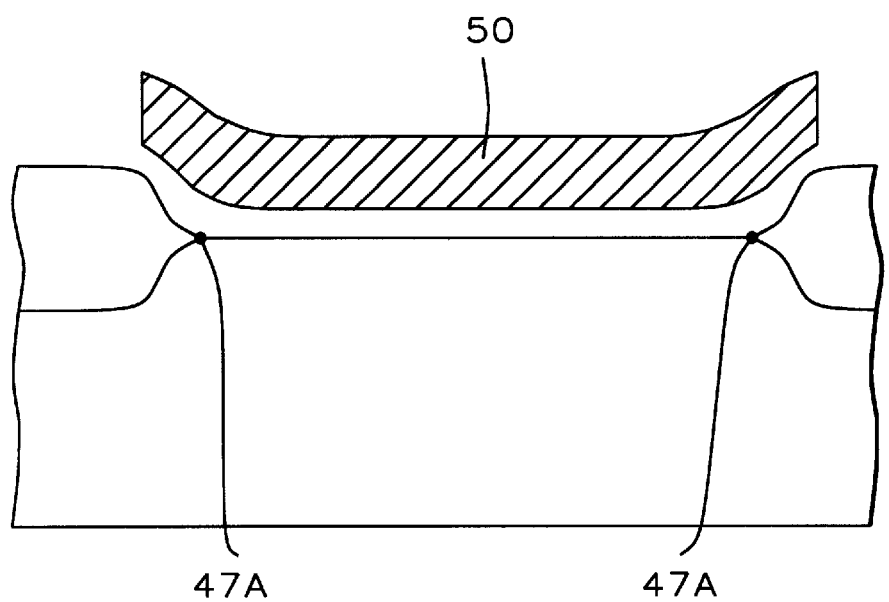
FIG. 9C is a cross sectional view along axis 9c shown in FIG. 9B.

The invention has many advantages over the prior art. More particularly, U.S. Pat. No. 5,518,941 (Lin) includes a field implant channel stop formed using a tilt angle ion implant. See Lin, col. 3—lines 42 to 55. However, the invention and Lin form the Boron implant regions (1) at different steps in the manufacturing process, (2) the implant regions have different profiles, and (3) solve different problems. First, the invention's threshold adjustment implant is formed right after the patterning of the Silicon nitride that defines the active regions. In contrast, Lin's field stop implant is formed after the patterning of the polysilicon gates. The boron doping pattern between the invention and Lin is very different under the field oxide at least because of the implant blocking of Lin's polysilicon gates over the field oxide regions. In addition, Lin's field oxide regions have be subjected to several etches have changed the field oxide shape. Lastly, as shown in FIGS. 9A, 9b and 9C, the invention solves "parasitic turn-on" along the width (of the gate) direction. In contrast, Lin's channel stop implant is a channel stop (increases breakdown voltage between adjacent source regions separated by a field oxide/channel stop region). FIG. 9A shows a top down view of two adjacent poly gates 50 with source/drain regions(e.g., N+) 54A 54B, 54C and 54D. The surround blank area is field oxide 20. FIG. 9B shows a cross sectional three dimension representation of a poly gate 50 with source/drain regions 54A, 54B, 54C and field oxide regions 20. FIG. 9C is a cross sectional view along axis 9C shown in FIG. 9B. The arrows 49 in FIGS. 9A, 9B and 9C show the leakage path the Lin's implant is effective against. However, Lin's device is still susceptible to the "parasitic turn on" or reverse narrow width effect represented by the arrows 49. The invention solves this "parasitic turn on" or reverse narrow width effect 49 problem by increasing the Boron concentration at the regions/points 47A under the bird's beak as shown in FIG. 9C. The invention's implant increases the threshold voltage under the bird's beak.

The large angled threshold voltage implant of the present invention eliminates the reverse narrow width effect. The large angled threshold voltage implant positions impurity ion under field oxide region near the birds beak forming a threshold voltage adjustment region. This threshold voltage adjustment region increases the threshold voltage under the bird's beak so that it is higher than the threshold voltage in the channel region. This increase the threshold voltage (Vt) for the transistor and reduces leakage current.

It should be well understood by one skilled in the art that by including additional process step not described in this embodiment, other types of devices can also be included on the DRAM chip. For example, P and N wells in the substrate and CMOS circuits can be formed therefrom. It should also be understood that the figures depict only one cell out of a multitude of cells that are fabricated simultaneously on the substrate.

While the invention has been particularly shown and described with reference to the preferred embodiments thereof, it will be understood by those skilled in the art that various changes in form and details may be made without departing from the spirit and scope of the invention.

What is claimed is:

1. A method of fabricating channel threshold implant regions to increase the dopant concentration under a bird's beak in a field oxide region; comprising the steps of:
   a) forming spaced field oxide regions on a semiconductor substrate, said field oxide regions having bird's beaks, said spaced field oxide regions defining a channel region;
   b) performing a field implant using said spaced field oxide region as an implant mask forming a deep channel stop region;
   c) forming a sacrificial oxide layer over the resulting surface;
   d) forming a threshold adjustment region by performing an angled implant of ions using said field oxide region as an implant mask implanting said ions into said channel region and under said bird's beak such that the threshold voltage is higher under said bird's beak than in said channel region; said angled implant comprises striking a tilted substrate with an ion beam, the substrate tilted at an angle between 15 and 45 degrees relative to said ion beam;
   e) removing said sacrificial oxide layer;
   f) forming a gate oxide layer over said channel region;
   g) forming a conductive layer over said gate oxide;
   h) patterning said conductive layer forming a gate electrode 50 over said channel region;
   i) forming source and drain regions adjacent to said gate electrode and adjacent to said field oxide regions.

2. The method of claim 1 wherein said spaced field oxide regions are formed by sequentially a pad oxide and a silicon nitride layer over said substrate; patterning said pad oxide and said silicon nitride layer forming spaced field oxide region openings exposing said substrate, oxidizing the exposed substrate forming spaced field oxide regions in said field oxide region openings.

3. The method of claim 1 wherein said spaced field oxide regions having a depth from the substrate surface in a range of between about 1500 and 2500 Å.

4. The method of claim 1 wherein said substrate contains at least a p-well and said field oxide regions and said channel region are formed over said p-well.

5. The method of claim 1 wherein said deep channel stop region having a concentration in a range of between about 1E17 atoms/cc and 5E17 atoms/cc and a depth from the substrate surface in a range of between about 1000 and 2500 Å.

6. The method of claim 1 wherein said field implant performed by implanting B ions at an energy in a range of between about 50 KeV and 130 KeV, a dose in a range of between about 5E12 and 5E13 atoms/cm$^2$.

7. The method of claim 1 wherein said angled implant comprises implanting BF$_2$ ions at an energy in a range of between about 150 KeV and 200 KeV, a dose in a range of between about 5E12 and 5E13 atoms/cm$^3$.

8. The method of claim 1 wherein said threshold adjustment region having a p-type concentration in a range of between about 1E17 atoms/cm$^3$ and 5E17 atoms/cm$^3$ and a depth from the substrate surface in a range of between about 500 and 1500 Å.

9. The method of claim 1 wherein said angled implant comprises implanting Phosphorus ions at an energy in a range of between about 40 KeV and 70 KeV, and at a dose in a range of between about 5E12 and 5E13 atoms/cm$^3$.

10. The method of claim 1 wherein said threshold adjustment regions having a n-type concentration in a range of between about 1E17 and 5E17 atoms/cm$^3$ and a depth from the substrate surface in a range of between about 500 and 1500 Å.

11. A method of fabricating channel threshold implant regions to increase the dopant concentration under a bird's beak in field oxide regions; comprising the steps of:
   a) forming spaced field oxide regions on a semiconductor substrate 10, said field oxide regions having bird's beaks, said spaced field oxide regions defining a channel region;

b) performing a field implant using said spaced field oxide region as an implant mask forming a deep channel stop region;

c) forming a sacrificial oxide layer over the resulting surface;

d) forming a threshold adjustment region by performing an angled implant of a p-type ions using said field oxide region as an implant mask implanting said p-type ions into said channel region and under said bird's beak such that the threshold voltage is higher under said bird's beak than in said channel region; said angled implant comprises striking a tilted substrate with an ion beam, the substrate tilted at an angle between 15 and 45 degrees relative to said ion beam; said angled implant implanting $BF_2$ ions at an energy in a range of between about 150 KeV and 200 KeV, a dose in a range of between about 5E12 and 5E13 atoms/cm$^3$; said threshold adjustment region having a concentration in a range of between about 1E17 atoms/cm$^3$ and 5E17 atoms/cm$^3$ and a depth from the substrate surface in a range of between about 500 and 1500 Å;

e) removing said sacrificial oxide layer;

f) forming a gate oxide layer over said channel region;

g) forming a conductive layer over said gate oxide;

h) patterning said conductive layer forming a gate electrode 50 over said channel region;

i) forming source and drain regions adjacent to said gate electrode and adjacent to said field oxide regions.

12. The method of claim 11 wherein said spaced field oxide regions are formed by sequentially a pad oxide and a silicon nitride layer over said substrate; patterning said pad oxide and said silicon nitride layer forming spaced field oxide region openings exposing said substrate, oxidizing the exposed substrate forming spaced field oxide regions in said field oxide region openings.

13. The method of claim 11 wherein said spaced field oxide regions having a depth form the substrate surface in a range of between about 1500 and 2500 Å.

14. The method of claim 11 wherein said substrate contains at least a p-well and said field oxide regions and said channel region are formed over said p-well.

15. The method of claim 11 wherein said deep channel stop region having a concentration in a range of between about 1E17 atoms/cc and 5E17 atoms/cc and a depth from the substrate surface in a range of between about 1000 and 2500 Å.

16. The method of claim 11 wherein said field implant performed by implanting B ions at an energy in a range of between about 50 KeV and 130 KeV, a dose in a range of between about 5E12 and 5E13 atoms/cm$^2$.

17. A method of fabricating channel threshold implant regions to increase the dopant concentration under bird's beaks in field oxide regions; comprising the steps of:

a) forming spaced field oxide regions on a semiconductor substrate, said field oxide regions having bird's beaks, said spaced field oxide regions defining a channel region;

b) performing a field implant using said spaced field oxide region as an implant mask forming a deep channel stop region; said deep channel stop region having a concentration in a range of between about 1E17 atoms/cc and 5E17 atoms/cc and a depth from the substrate surface in a range of between about 1000 and 2500 Å; said field implant performed by implanting B ions at an energy in a range of between about 50 KeV and 130 KeV, a dose in a range of between about 5E12 and 5E13 atoms/cm$^2$;

c) forming a sacrificial oxide layer over the resulting surface;

d) forming a threshold adjustment region by performing an angled implant of a p-type ions using said field oxide region as an implant mask implanting said p-type ions into said channel region and under said bird's beak whereby the threshold voltage is higher under said bird's beak than in said channel region; said angled implant comprises striking a tilted substrate with an ion beam, the substrate tilted at an angle between 15 and 45 degrees relative to said ion beam; said angled implant implanting $BF_2$ ions at an energy in a range of between about 150 KeV and 200 KeV, a dose in a range of between about 5E12 and 5E13 atoms/cm$^3$; said threshold adjustment region having a concentration in a range of between about 1E17 atoms/cm$^3$ and 5E17 atoms/cm$^3$ and a depth from the substrate surface in a range of between about 500 and 1500 Å;

e) removing said sacrificial oxide layer;

f) forming a gate oxide layer over said channel region;

g) forming a conductive layer over said gate oxide;

h) patterning said conductive layer forming a gate electrode 50 over said channel region;

i) forming source and drain regions adjacent to said gate electrode and adjacent to said field oxide regions.

* * * * *